(12) United States Patent
Yoon et al.

(10) Patent No.: US 9,916,979 B2
(45) Date of Patent: Mar. 13, 2018

(54) METHODS FOR MANUFACTURING A SEMICONDUCTOR DEVICE

(71) Applicant: Samsung Electronics Co., Ltd., Suwon-si, Gyeonggi-do (KR)

(72) Inventors: Chan Sic Yoon, Anyang-si (KR); Ki Seok Lee, Busan (KR); Dong Oh Kim, Daegu (KR); Yong Jae Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/381,135

(22) Filed: Dec. 16, 2016

(65) Prior Publication Data

US 2017/0309469 A1    Oct. 26, 2017

(30) Foreign Application Priority Data

Apr. 25, 2016    (KR) .................. 10-2016-0050200

(51) Int. Cl.
*H01L 21/02*      (2006.01)
*H01L 21/027*     (2006.01)
*G03F 1/38*       (2012.01)

(52) U.S. Cl.
CPC .............. *H01L 21/027* (2013.01); *G03F 1/38* (2013.01); *H01L 21/02107* (2013.01); *H01L 21/02697* (2013.01)

(58) Field of Classification Search
CPC ............. H01L 21/027; H01L 21/02107; H01L 21/02697; G03F 1/38
See application file for complete search history.

(56) References Cited

U.S. PATENT DOCUMENTS

| 7,247,906 | B2 | 7/2007 | Park et al. |
|---|---|---|---|
| 8,253,254 | B2 | 8/2012 | Ujihara |
| 8,637,990 | B2 | 1/2014 | Kim et al. |
| 9,041,122 | B2 * | 5/2015 | Yoo ..................... H01L 23/5225 257/384 |
| 9,064,731 | B2 | 6/2015 | Park |

(Continued)

FOREIGN PATENT DOCUMENTS

| JP | 2013-175584 | 9/2013 |
|---|---|---|
| KR | 2003-0070201 | 8/2003 |

(Continued)

*Primary Examiner* — Karen Kusumakar
(74) *Attorney, Agent, or Firm* — Ward and Smith, P.A.

(57) ABSTRACT

Methods for manufacturing a semiconductor device include forming a gate line extending in a first direction in a substrate, and an impurity region on a side surface of the gate line, forming an insulating film pattern on the substrate, the insulating film pattern extending in the first direction and comprising a first through-hole that is configured to expose the impurity region, forming a barrier metal layer on the first through-hole, forming a conductive line contact that fills the first through-hole and that is electrically connected to the impurity region, forming a first mask pattern on the conductive line contact and the insulating film pattern, the first mask pattern extending in a second direction that is different from the first direction and the first mask pattern comprising a first opening, and removing corners of the barrier metal layer by partially etching the barrier metal layer.

20 Claims, 25 Drawing Sheets

(56) References Cited

U.S. PATENT DOCUMENTS

2013/0288472 A1 10/2013 Choi et al.
2014/0374809 A1* 12/2014 Park .................. H01L 27/1085
                                                    257/296

FOREIGN PATENT DOCUMENTS

| KR | 2007-0038225 | 4/2007 |
| KR | 2011-0001722 | 1/2011 |
| KR | 10-1185951 | 9/2012 |
| KR | 2014-0131172 | 11/2014 |
| KR | 2015-0024986 | 3/2015 |

* cited by examiner

1200

1300

1400

METHODS FOR MANUFACTURING A SEMICONDUCTOR DEVICE

This application claims priority from Korean Patent Application No. 10-2016-0050200 filed on Apr. 25, 2016 in the Korean Intellectual Property Office, the disclosure of which is incorporated herein by reference in its entirety.

BACKGROUND OF THE INVENTIVE CONCEPT

1. Field of the Inventive Concept

The present inventive concept relates to methods for manufacturing a semiconductor device.

2. Description of the Related Art

As semiconductor devices are highly integrated and their patterns become minute, various attempts have been made to manufacture the semiconductor devices with improved characteristics. In particular, various methods for manufacturing a landing pad that supports eccentricity, while ensuring a stable contact between an upper conductor and a lower conductor such as a bit line or a storage electrode in a structure such as a memory cell having a honeycomb structure may be performed.

SUMMARY OF THE INVENTIVE CONCEPT

An aspect of the present inventive concept provides methods for manufacturing a semiconductor device that allows a self-alignment to be performed using a previously patterned fence and allows a lithography process to be reduced in forming a landing pad.

Another aspect of the present inventive concept provides methods for manufacturing a semiconductor device that allows a process margin to be ensured by partially etching the landing pad.

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

According to an aspect of the present inventive concept, there is provided a method for manufacturing a semiconductor device including forming a gate line extending in a first direction in a substrate, and an impurity region on a side surface of the gate line, forming an insulating film pattern on the substrate, the insulating film pattern extending in the first direction and comprising a first through-hole for exposing the impurity region, forming a barrier metal layer on the first through-hole, forming a conductive line contact that fills the first through-hole and is electrically connected to the impurity region, forming a first mask pattern on the conductive line contact and the insulating film pattern, the first mask pattern extending in a second direction different from the first direction and comprising a first opening, forming a landing pad by performing a photolithography process using the first mask pattern, and removing corners by partially etching the barrier metal layer.

According to another aspect of the present inventive concept, there is provided a method for manufacturing a semiconductor device including forming a gate line extending in a first direction in a substrate, and an impurity region on a side surface of the gate line, forming insulating film patterns extending in the first direction on the substrate, forming a conductive line contact in a first through-hole between the insulating film patterns, using the insulating film patterns as a negative pattern, forming a barrier metal layer on the first through-hole, forming a first mask pattern on the insulating film pattern, the first mask pattern extending in a second direction different from the first direction and comprising a first opening, forming a landing pad by performing a photolithography process, using the first mask pattern as a positive pattern, and removing corners by partially etching the barrier metal layer.

BRIEF DESCRIPTION OF THE DRAWINGS

The above and other aspects and features of the present inventive concept will become more apparent by describing in detail example embodiments thereof with reference to the attached drawings, in which.

DETAILED DESCRIPTION OF THE INVENTIVE CONCEPT

Figure 1:
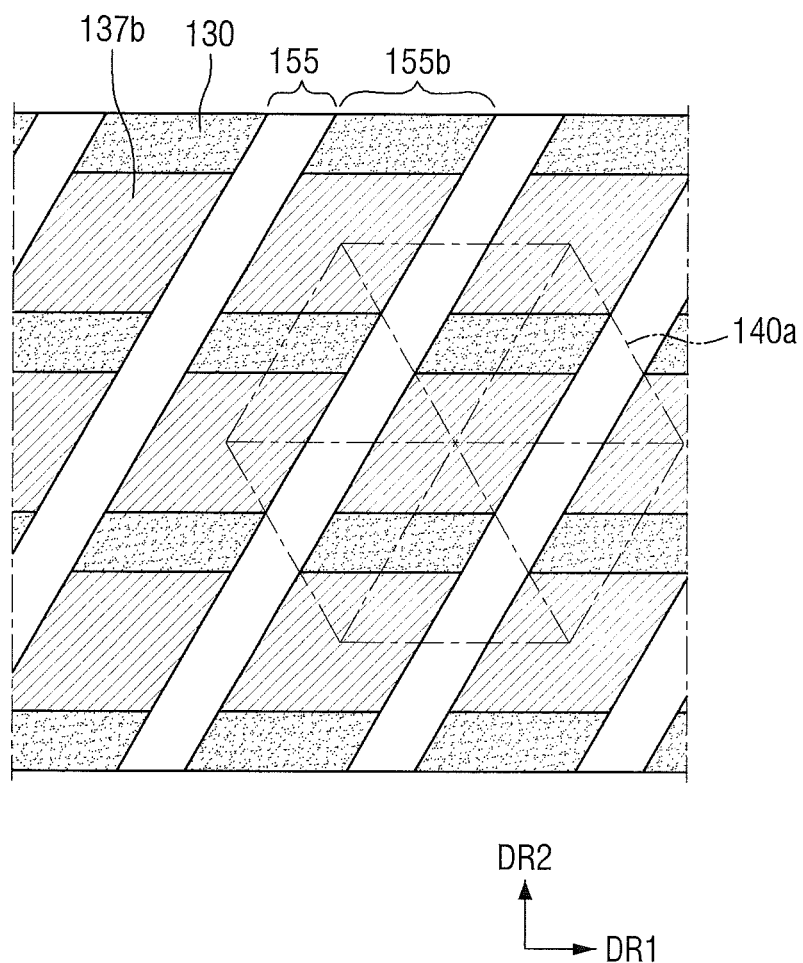
FIG. 1 is a plan view for illustrating a semiconductor device according to some embodiments of the present inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Advantages and features of the present disclosure and methods of accomplishing the same may be understood more readily by reference to the following detailed description of preferred embodiments and the accompanying drawings.

FIG. 1 is a plan view for illustrating a semiconductor device according to some embodiments of the present inventive concept.

Referring to FIG. 1, a semiconductor device according to some embodiments of the present inventive concept includes a fence 130 and a second contact 137b.

The fence 130 includes an insulating material, e.g., SiN. The fence 130 is formed to extend in a first direction DR1, and is formed on a gate line 108 that includes a buried gate structure, as described below in conjunction with FIG. 7. The fence 130 serves as a separation film and may also serve to self-align the second contact 137b in a first direction DR1.

The second contact 137b includes a honeycomb structure 140a, and may serve as a landing pad. The second contact 137b as the landing pad may have a parallelogram shape in some embodiments of the present inventive concept.

Therefore, it is possible to form the fence 130 and a first mask pattern 155 including a first opening 155b extending in one direction on the second contact 137b. Here, the one direction may form an acute angle, e.g., 60° with the first direction DR1. Further, the first opening 155b includes a line shape, and the one direction may form an acute angle with the first direction DR1. Specifically, the line shape may include an oblique line shape.

Such a landing pad of a parallelogram shape may be formed by performing a photolithography process using the first mask pattern 155. Thus, the landing pad according to some embodiments of the present inventive concept may be self-aligned in the first direction DR1 using the previously patterned fence 130, and thereafter, the landing pad may be formed simply by a single photolithography process using the first mask pattern 155. That is, such a fence 130 may be used as a negative pattern for self-aligning the landing pad in the first direction DR1, and the first mask pattern 155 may be used as a positive pattern in a photolithography process for forming the landing pad in a parallelogram shape. Thus, it is possible to reduce the cost of process.

Meanwhile, the shape of the second contact 137b as the landing pad in some other embodiments of the present inventive concept may be defined by the first mask pattern 155 having a first opening 155d (FIG. 18) of a waveform shape, and the shape thereof may also be defined by the first mask pattern 155 having a first opening 155f (FIG. 22) having a line shape extending in one direction.

This will be described in detail later with reference to FIGS. 13 to 23.

Hereinafter, methods for manufacturing a semiconductor device according to some embodiments of the present inventive concept will be described with reference to FIGS. 2 to 10.

FIGS. 2 to 10 are cross-sectional views for illustrating methods for manufacturing a semiconductor device according to some embodiments of the present inventive concept.

Figure 2:
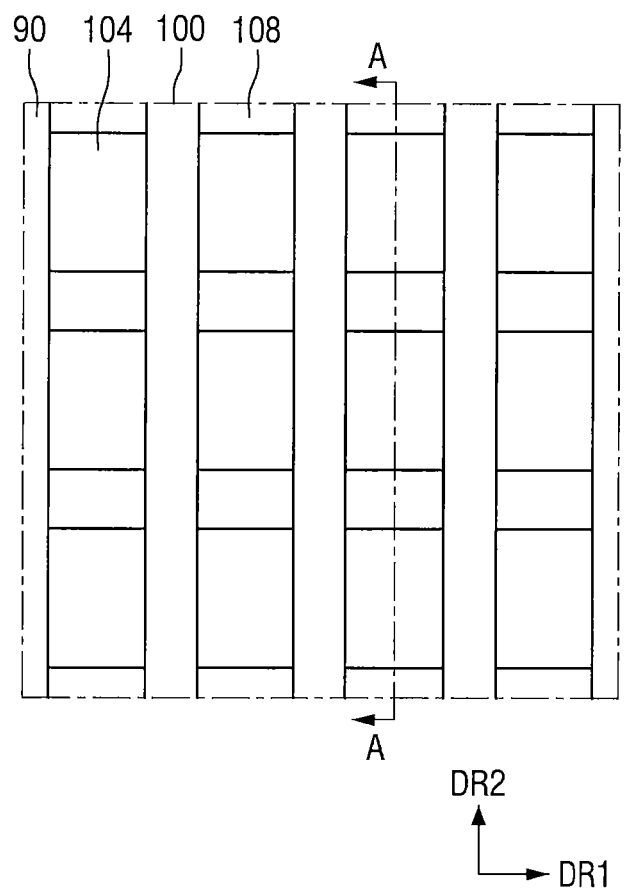
FIGS. 2 to 10 are cross-sectional views for illustrating methods for manufacturing a semiconductor device according to some embodiments of the present inventive concept.

Referring to FIG. 2, a semiconductor device 1 includes a substrate 100, a bit line 90 and a gate line 108.

The substrate 100 includes an impurity region 104, and the impurity region 104 may be formed between the gate lines 108 formed in the substrate 100. Further, the impurity region 104 may include a source and a drain.

The gate line 108 extends in the first direction DR1, and is formed by being buried in the substrate 100. The bit line 90 extends in a second direction DR2, and is formed on the substrate 100. Specifically, the bit line 90 is formed to intersect with the gate line 108, and the second direction DR2 may be perpendicular to the first direction DR1.

Figure 3:
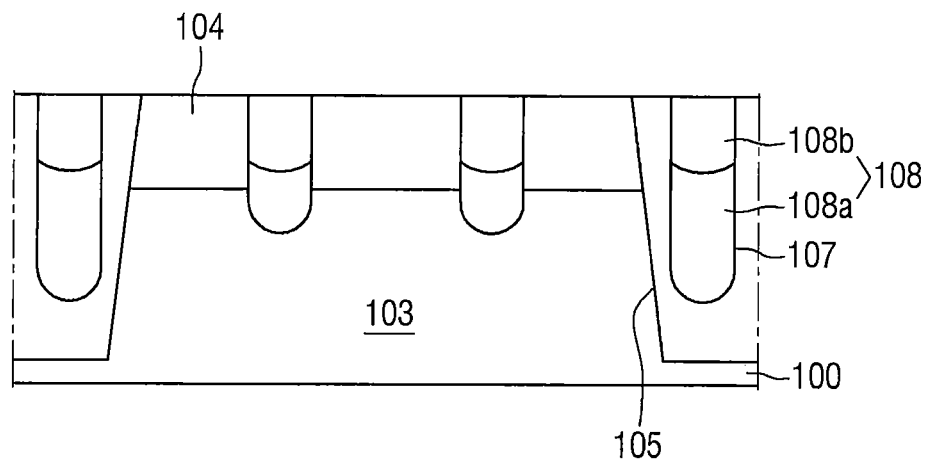

Referring to FIGS. 2 and 3, a gate line 108 extending in the first direction DR1 is formed in the substrate 100, and an impurity region 104 is formed on the side surface of the gate line 108.

Specifically, in order to form the gate line 108 including the buried gate structure, a trench 107 is formed in an element isolation film 105. The trench 107 may be formed using an etching process, and for example, a lithography process and a dry etching process may be included. After the etching process, a gate conductive layer 108a is formed in the trench 107. The gate conductive layer 108a may include, but not limited to, polysilicon. The gate conductive layer 108a is left only in the lower portion of the trench 107 through the etching process. The etching process may include an etch-back process. After the etch-beck process, a gate metal layer 108b is formed on the substrate 100 including the gate conductive layer 108a. The gate metal layer 108b may include, but not limited to, Ti, Ta, TiN, TaN, W, Wn and/or WSi.

After forming the gate metal layer 108b, a CMP process is performed until the upper surface of the substrate 100 is exposed. The gate conductive layer 108a and the gate metal layer 108b are sequentially formed in the trench 107 by the CMP process, and a buried gate structure is completed.

The impurity region 104 is a region formed on the top of an active region 103 and may include a source and a drain, but it is not limited thereto. For example, the impurity region 104 may be formed between the gate lines 108.

Figure 4:
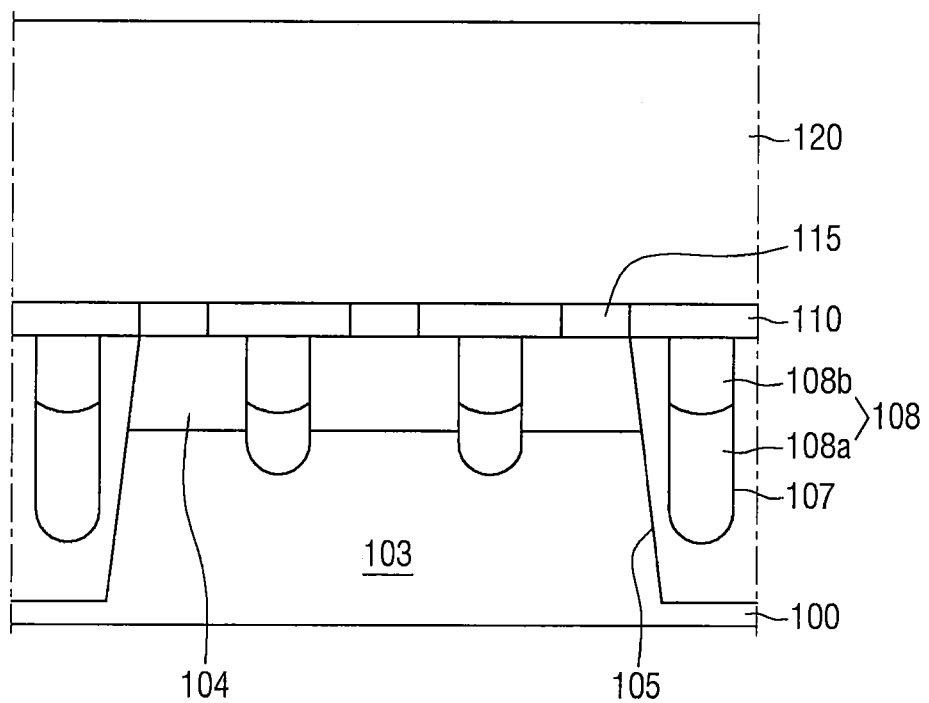

Referring to FIG. 4, the formation of the insulating film pattern may include formation of a gate hard mask layer 110, a sacrificial film 115 and an interlayer insulating film 120.

Specifically, the gate hard mask layer 110 may be formed on the substrate 108b formed with the gate metal layer 100. That is, a gate hard mask layer 110 that overlaps the gate line 108 is formed.

The sacrificial film 115 may be formed between the gate hard mask layers 110. The sacrificial film 115, for example, may include, but not limited to, a nitride film. Specifically, the sacrificial film 115 may be formed on the substrate 100 including the patterned gate hard mask layer 110. After forming the sacrificial film 115, the CMP process is performed until the top surface of the gate hard mask layer 110 is exposed.

After forming the sacrificial film 115, the interlayer insulating film 120 is formed on the sacrificial film 115 and the gate hard mask layer 110. The interlayer insulating film 120, for example, may include, but not limited to, an oxide layer.

Figure 5:
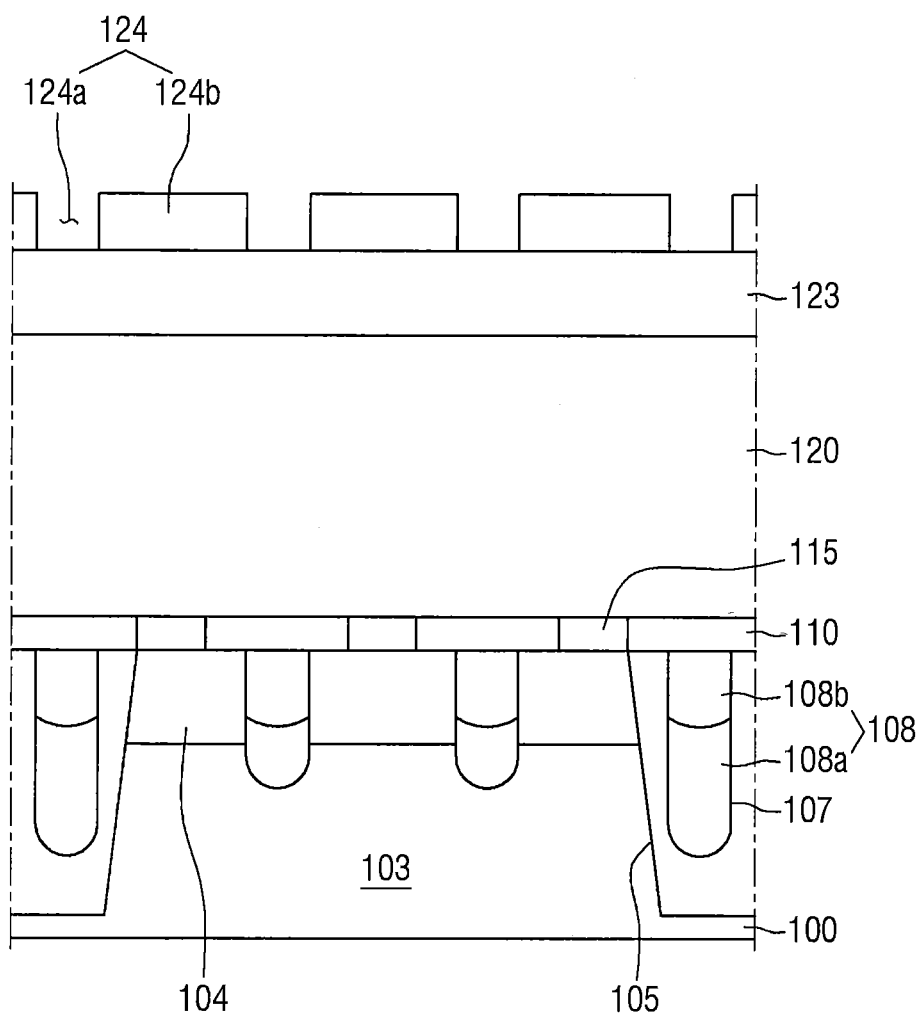

Referring to FIG. 5, a shielding film 123 is formed on the interlayer insulating film 120.

For example, the shielding film 123 may include, but, not limited to, an oxide film or a polysilicon film. The shielding film 123 may remove an interference signal generated in the semiconductor device and/or may block the interference signal from being emitted to the outside. Further, the shielding film 123 may prevent the external interference signal from affecting the semiconductor device.

A second mask pattern 124 is formed on the shielding film 123. The second mask pattern 124 extends in a first direction (DR1 in FIG. 1), and includes a second opening 124a which overlaps the gate line 108. Specifically, the second mask pattern 124 may include a second opening 124a, and a region 124b that defines the second opening 124a.

Figure 6:
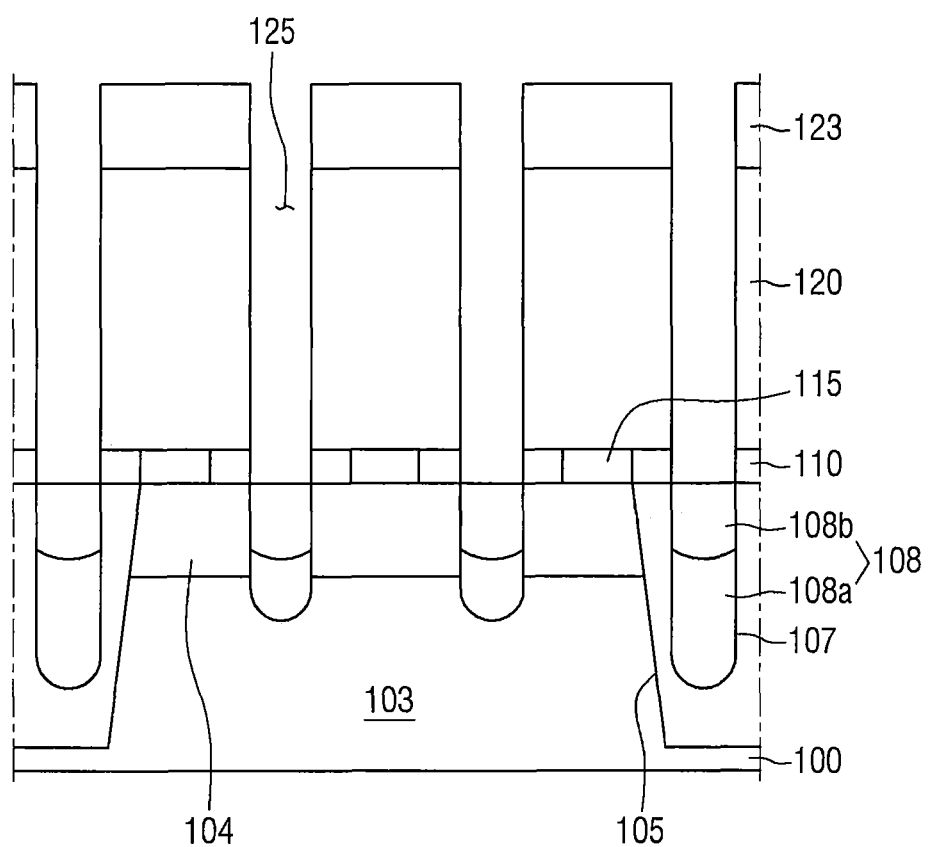

Referring to FIG. 6, a second through-hole 125 that penetrates the shielding film 123, the interlayer insulating film 120 and the gate hard mask layer 110 is formed.

Specifically, the formation of the second through-hole 125 may include removal of the shielding film 123, the interlayer insulating film 120 and the gate hard mask layer 110, using the second mask pattern 124 as an etching mask. The gate line 108 is exposed by the second through-hole 125. That is to say, the second through-hole 125 exposes the gate metal layer 108b. The second through-hole 125, for example, may be formed using one of the wet etching, the dry etching and a combination thereof. After performing the etching process, the second mask pattern 124 is removed.

Figure 7:
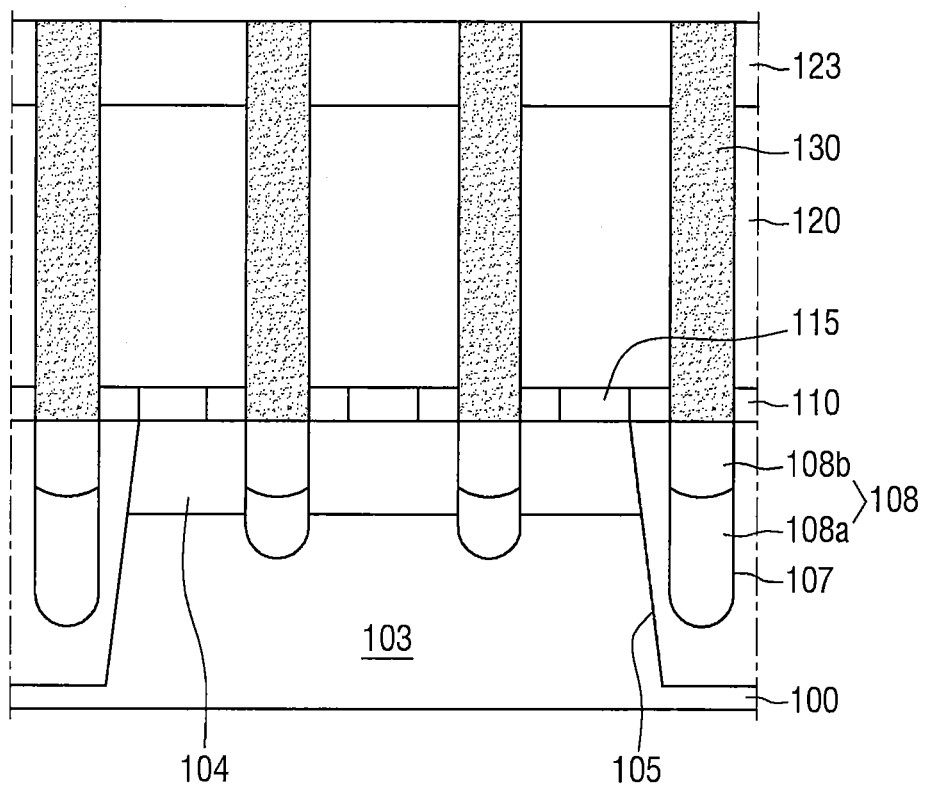

Referring to FIG. 7, the fence 130 is formed by filing the second through-hole 125 with an insulating material.

An insulating material for forming the fence 130, for example, may include SiN, may have high etching selectivity over the shielding film 123 and the interlayer insulating film 120. Furthermore, the fence 130 not only may serve as a separation film, but may also serve to self-align the first through-hole 135 in the first direction (DR1 in FIG. 2).

Figure 8:
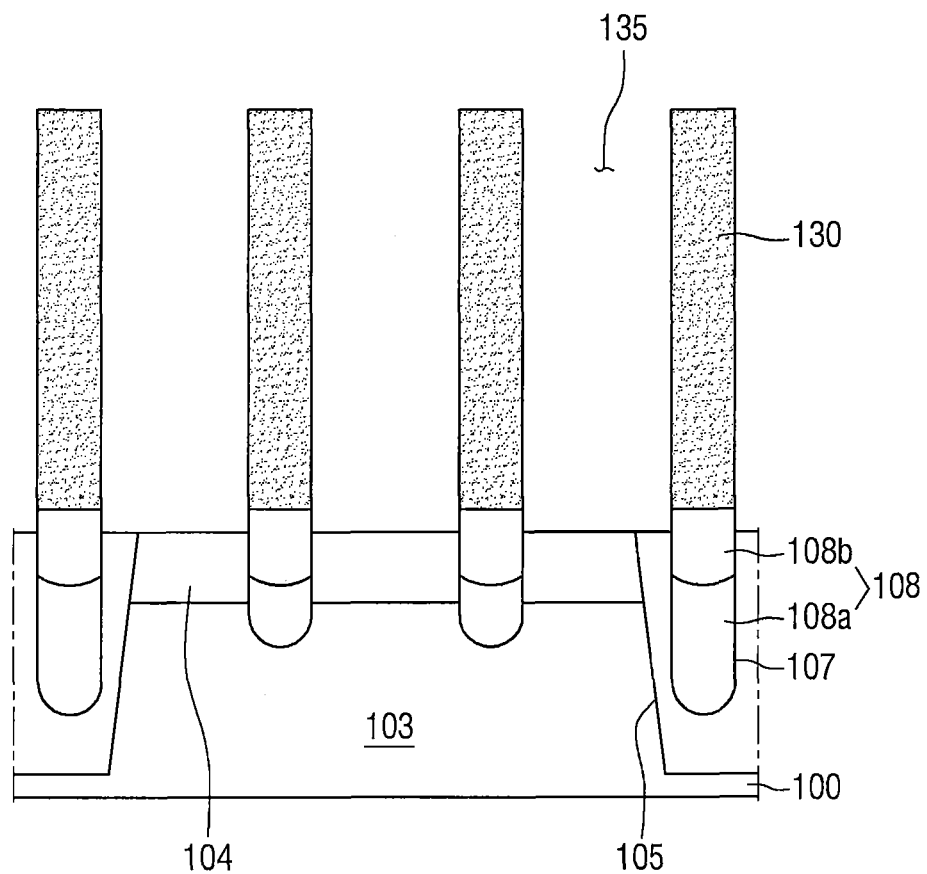

Referring to FIG. 8, after forming the fence 130, the shielding film 123, the interlayer insulating film 120, the sacrificial film 115, and the gate hard mask layer 110 are removed to form the first through-hole 135.

Specifically, the interlayer insulating film 120 and the shielding film 123 are etched. The etching process is performed using the fence 130 as a mask, and may include a wet etching process. For example, the etching rates of the interlayer insulating film 120 and the shielding film 123 for an etchant used in the wet etching may be larger than the etching rate of the fence 130 for the etchant used in the wet etching. Specifically, since the etching rate of the fence 130 is very slow, the fence 130 is left without being etched, while the interlayer insulating film 120 and the shielding film 123 are etched. After etching the interlayer insulating film 120 and the shielding film 123, the gate hard mask layer 110 and the sacrificial film 115 are etched. For example, the gate hard mask layer 110 and the sacrificial film 115 may be etched, using the fence 130 as a mask. At this time, the etching process is performed to a depth at which the gate metal layer 108b is partially exposed. This allows the first contact 137a formed in the next process to connect the gate line 108 and the bit line (90 in FIG. 2).

Figure 9:
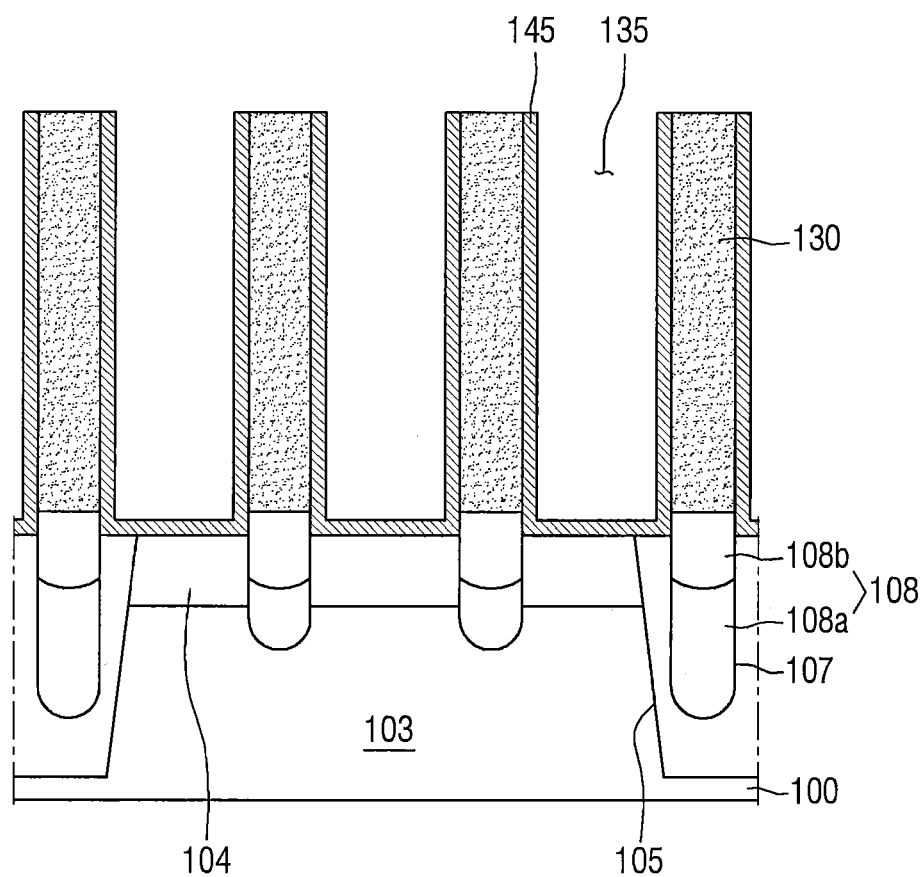

Referring to FIG. 9, barrier metal layers 145 are formed along the side surfaces of the fence 130. In some embodiments of the present inventive concept, the barrier metal layers 145 may be conformally formed along the side surfaces of the fence 130. Meanwhile, in some embodiments of the present inventive concept, the barrier metal layers 145 may include, but not limited to, Ti, Ta, TiN, TaN, W, Wn and/or WSi.

Figure 10:
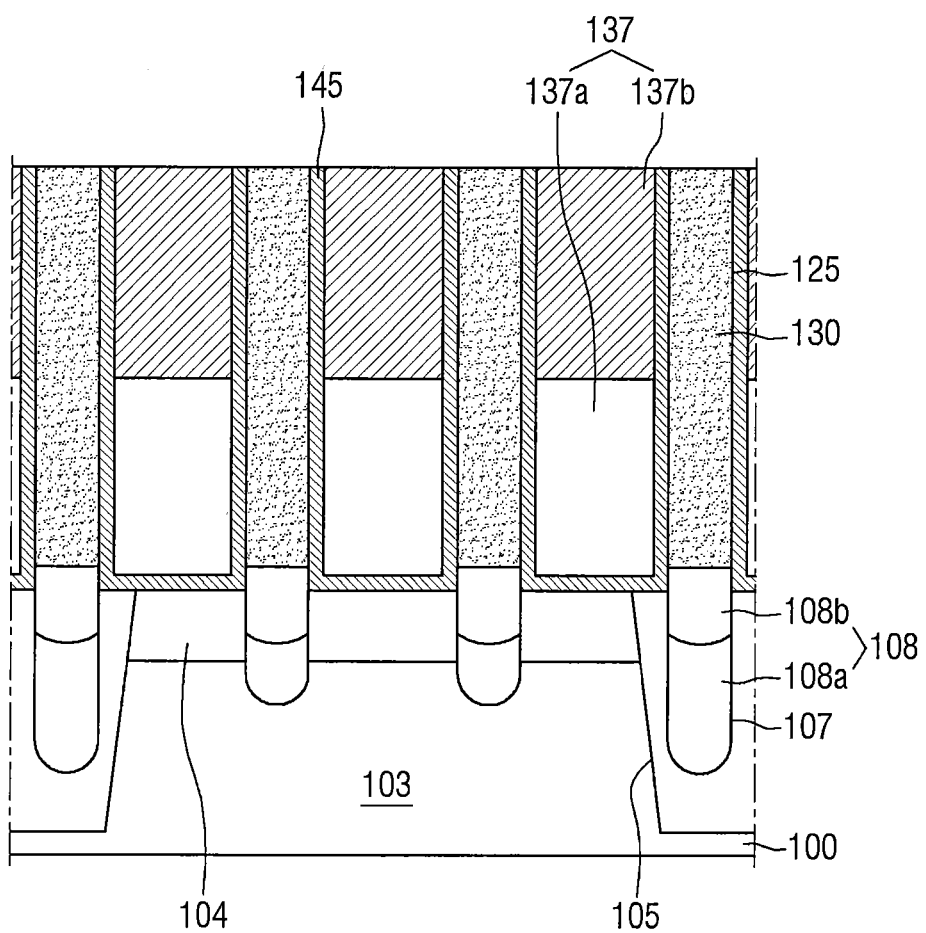

Referring to FIG. 10, the first through-hole 135 formed with the barrier metal layers 145 is filled to form a conductive line contact 137 that is electrically connected to the impurity region 104.

Specifically, the formation of the conductive line contact 137 may include formation of the first contact 137a that partially fills the first through-hole 135, and formation of the second contact 137b on the first contact 137a. For example, the first contact 137a may include a gate bit line contact pad. Further, the first contact 137a may serve to connect the gate line 108 and the bit line 90. The second contact 137b may include a landing pad line. Further, the second contact 137b may include, but is not limited to, one of a metal film, a polysilicon film, a laminated structure of an epitaxial silicon film and/or a polysilicon film using an optional epitaxial growth, and a laminated structure of an epitaxial silicon film and a metal film using the optional epitaxial growth.

The conductive line contact 137 including the first contact 137a and the second contact 137b may be self-aligned to the fence 130. That is, the conductive line contact 137 may be self-aligned to the fence 130 in the first direction (DR1 in FIG. 9).

Figure 11:
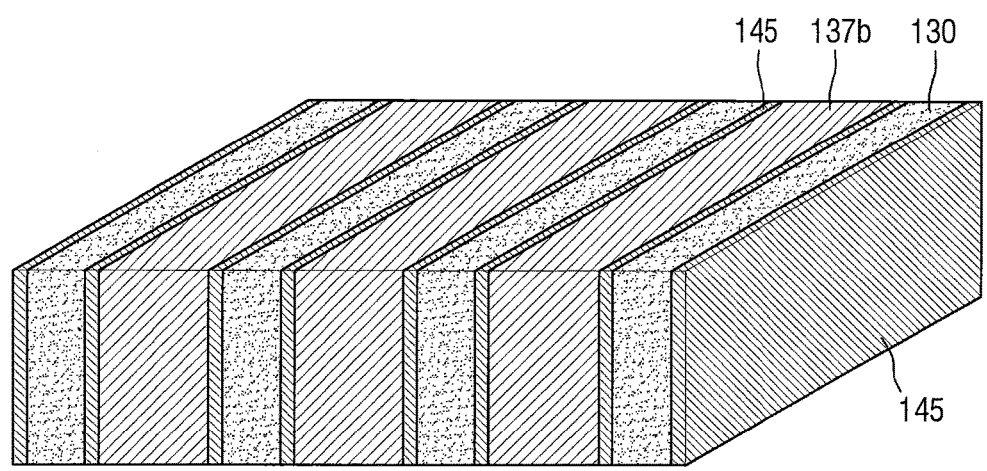
FIG. 11 is a perspective view for explaining a semiconductor device according to some embodiments of the present inventive concept.
Figure 12:
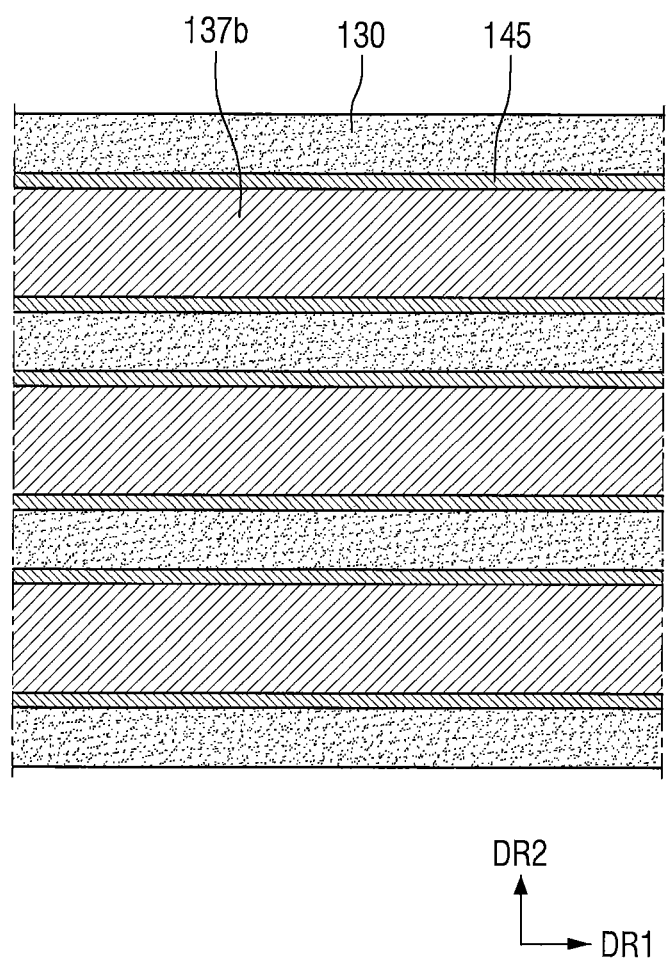
FIG. 12 is a top view for illustrating the semiconductor device of FIG. 11.

FIG. 11 is a perspective view for illustrating a semiconductor device according to some embodiments of the present inventive concept, and FIG. 12 is a top view for illustrating the semiconductor device of FIG. 11.

Referring to FIGS. 11 and 12, the self-alignment of the second contact 137b to the fence 130 in the first direction DR1 can be checked in a direction different from FIG. 10.

Figure 13:
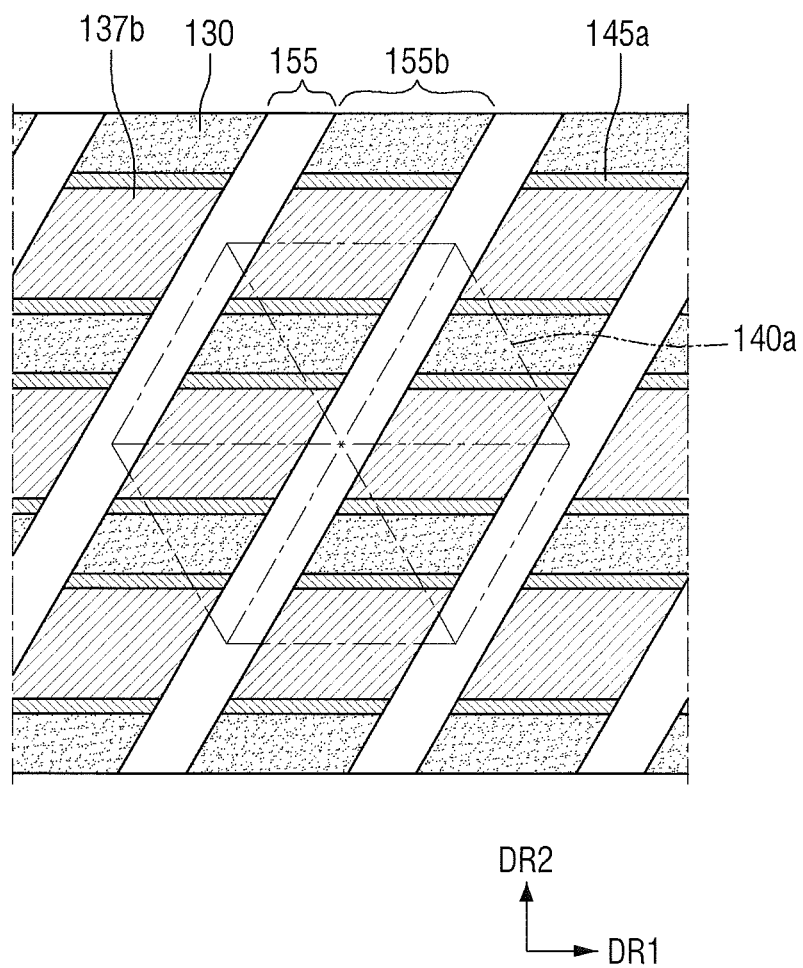
FIGS. 13 to 15 are cross-sectional views illustrating methods for manufacturing a semiconductor device according to some other embodiments of the present inventive concept.
Figure 14:
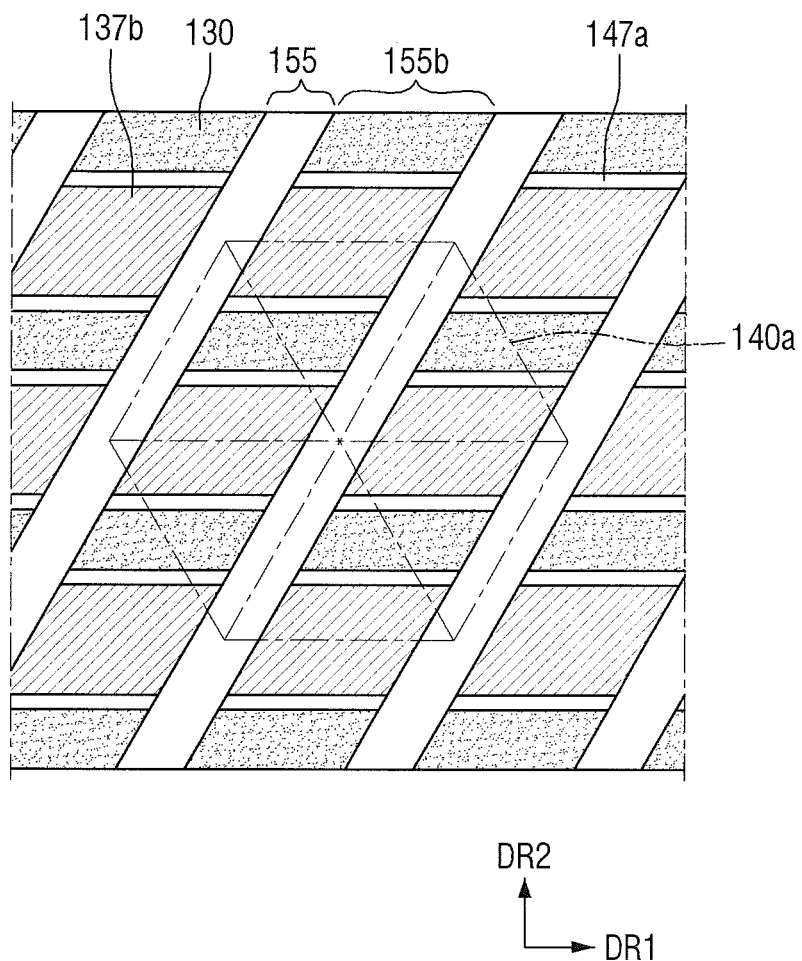
Figure 15:
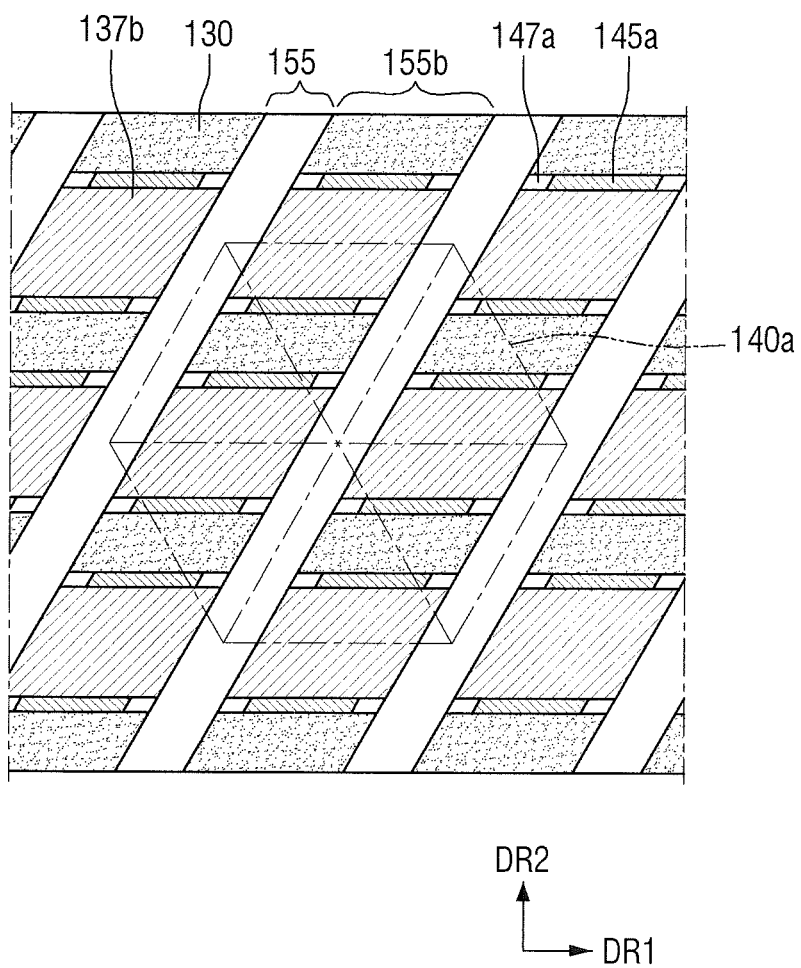
Figure 16:
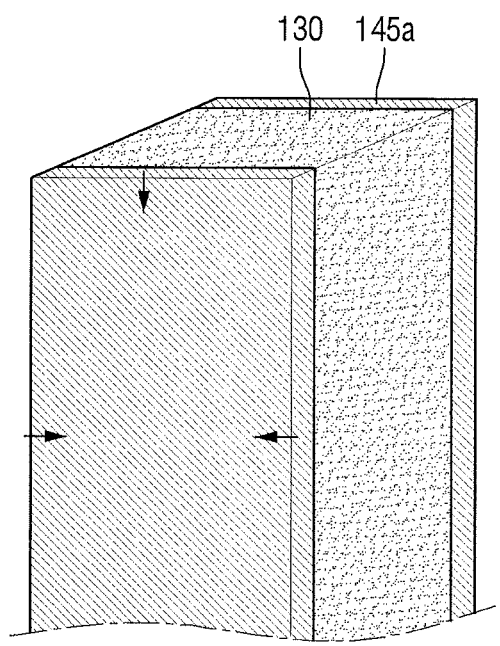
FIGS. 16 and 17 are perspective views for illustrating the semiconductor device of FIGS. 13 to 15.
Figure 17:
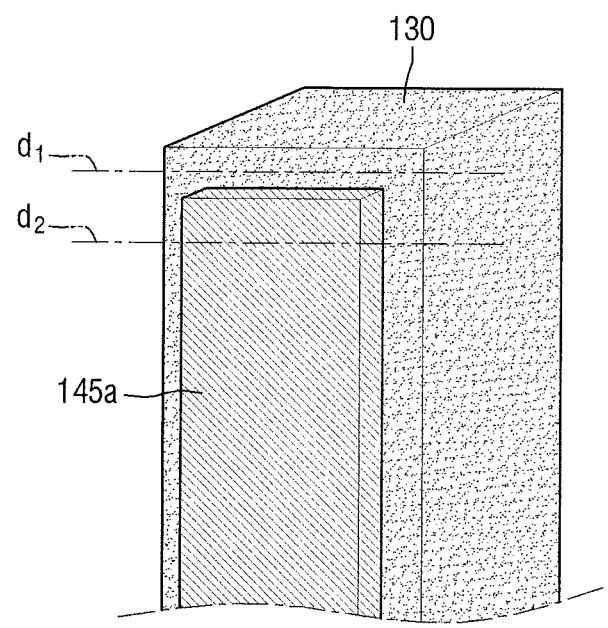

FIGS. 13 to 15 are cross-sectional views illustrating methods for manufacturing a semiconductor device according to some other embodiments of the present inventive concept, and FIGS. 16 and 17 are perspective views for illustrating the semiconductor device of FIGS. 13 to 15.

Referring to FIGS. 13 to 15, a barrier metal layer 145a formed along the second contact 137b of the landing pad line is partially etched to remove the corner thereof. In some embodiments of the present inventive concept, the etching may include the wet etching.

Specifically, as illustrated in FIG. 13, a fence 130 and a first mask pattern 155 can be formed on the top surface of the semiconductor device as illustrated in FIGS. 11 and 12, and the first mask pattern 155 includes a first opening 155b which extends in one direction on the second contact 137b. Here, the one direction may form an acute angle, e.g., 60° with the first direction DR1. Further, the first opening 155b includes a line shape, and the one direction may form an acute angle with the first direction DR1. Specifically, the line shape may contain an oblique line shape. In the case of the oblique line shape, the second contact 137b may include a honeycomb structure 140a.

Referring to FIG. 16 together, the barrier metal layers 145a are formed along both side surfaces of the fence 130.

Subsequently, referring to FIG. 13, the barrier metal layers 145a are partially on the basis of the fence 130 and the first mask pattern 155 to remove their corners. Referring to FIG. 17 together, the barrier metal layers 145a formed along the side surfaces of the fence 130 are etched in at least three directions. Thus, both side surfaces and the top surfaces of the barrier metal layers 145a are partially removed. That is, FIG. 14 corresponds to the cross-section taken along a line $d_1$ of FIG. 17, and a hole 147a provided after the removal of the barrier metal layer 145a is formed in the region where there were the barrier metal layers 145a in FIG. 13.

Subsequently, referring to FIG. 15, FIG. 15 corresponds to the cross-section of a line $d_2$ of FIG. 17, holes 147a are formed on both ends of the region where there were the barrier metal layers 145a in FIG. 13, and the barrier metal layers 145a having a shape of a reduced size are formed.

Figure 18:
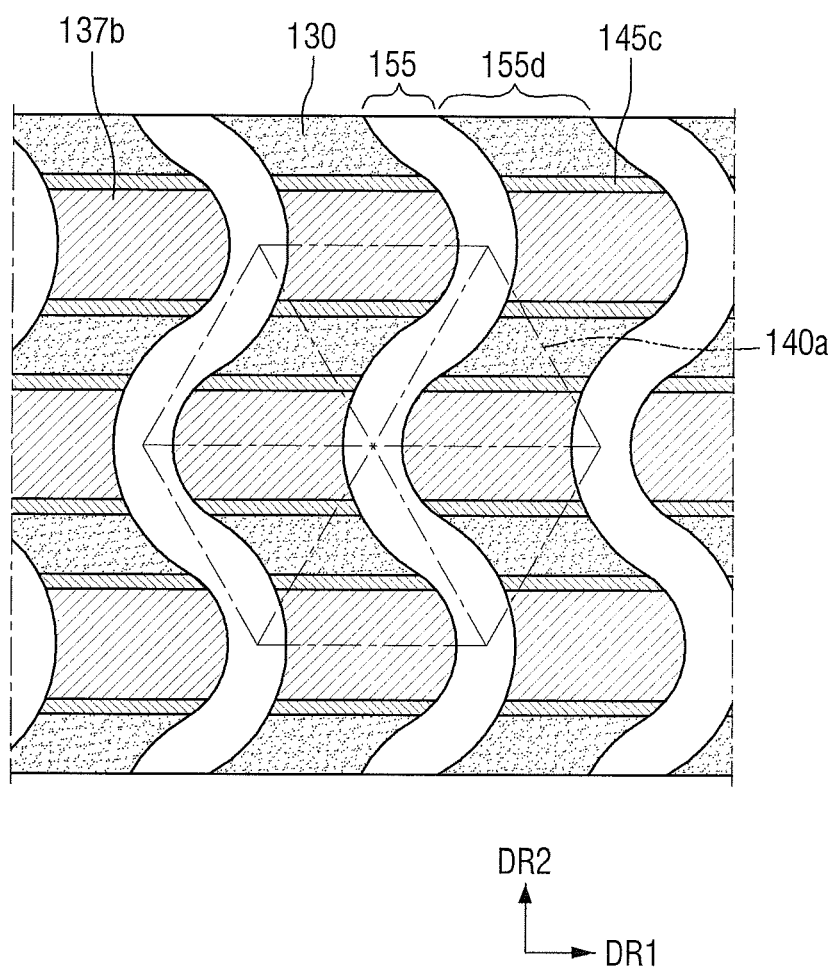
FIGS. 18 to 20 are cross-sectional views illustrating methods for manufacturing a semiconductor device according to some other embodiments of the present inventive concept.
Figure 19:
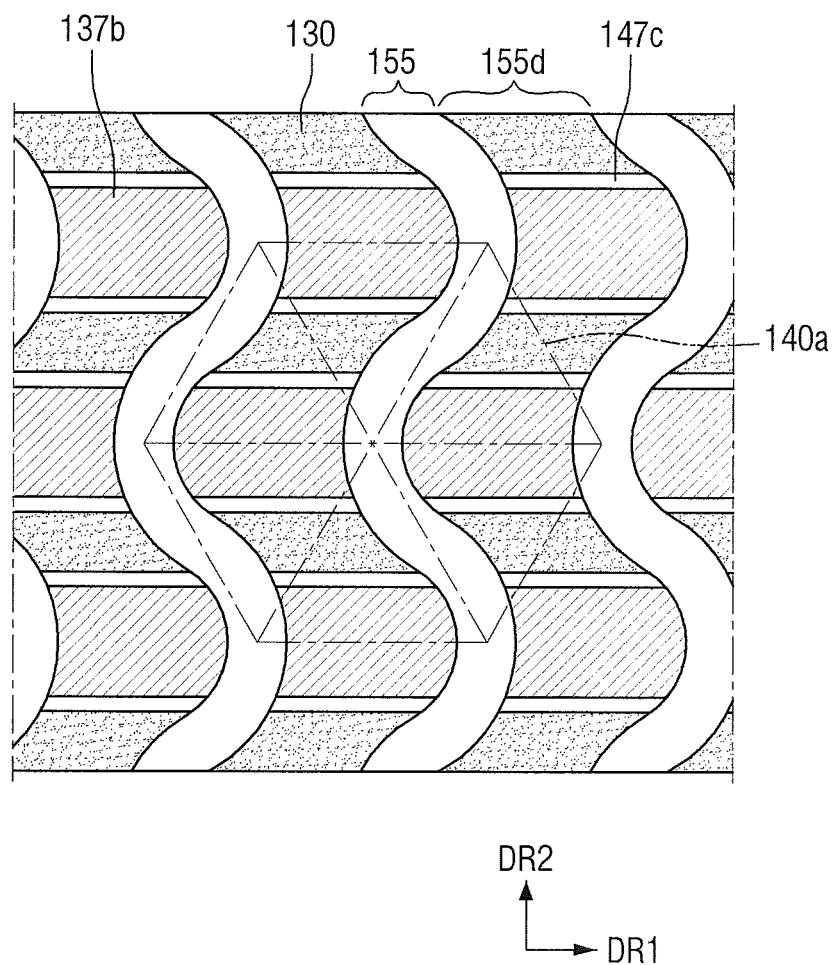
Figure 20:
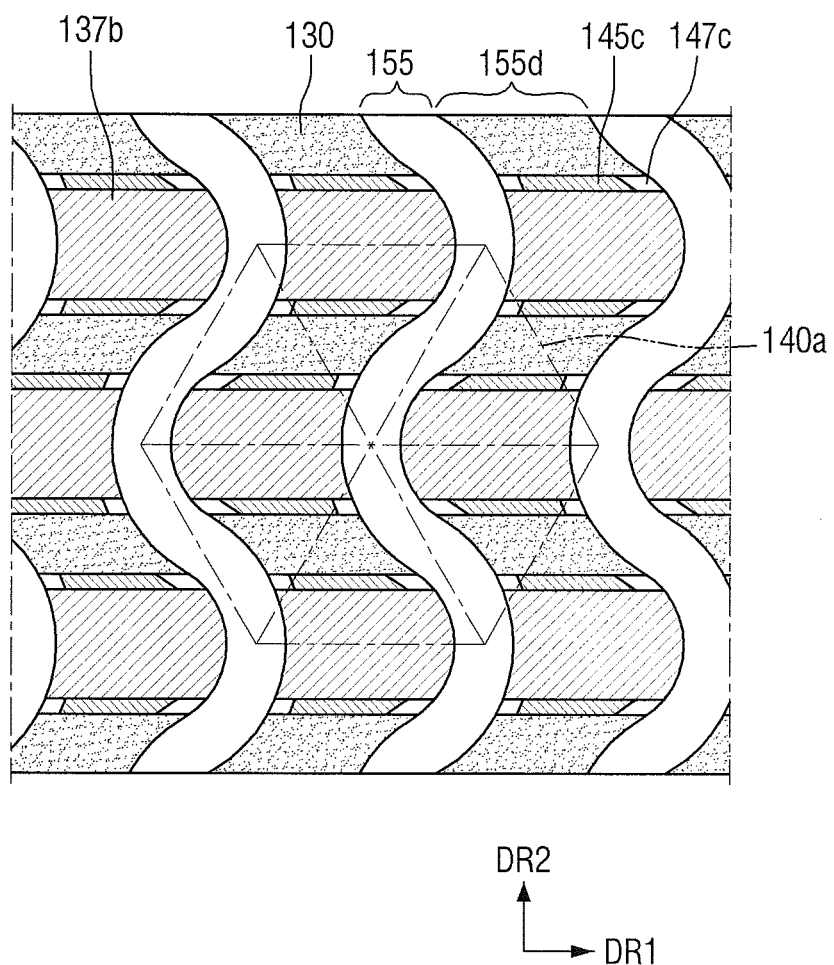

FIGS. 18 to 20 are cross-sectional views illustrating methods for manufacturing a semiconductor device according to some other embodiments of the present inventive concept.

Referring to FIGS. 18 to 20, the barrier metal layers 145c formed along the second contact 137b of the landing pad line are partially etched to remove their corners. In some embodiments of the present inventive concept, the etching may include the wet etching.

Specifically, as illustrated in FIG. 18, the fence 130 and a first mask pattern 155 may be formed on the top surface of the semiconductor device as illustrated in FIGS. 11 and 12. The first mask pattern 155 includes a first opening 155d extending in a waveform shape on the second contact 137b. In the case of a waveform shape, the second contact 137b may include a honeycomb structure 140a. Meanwhile, similar to the description of FIG. 13, the barrier metal layers 145c are formed along both side surfaces of the fence 130.

Next, with reference to FIG. 19, the barrier metal layers 145c are partially etched on the basis of the fence 130 and the first mask pattern 155 to remove their corners. Similar to the description of FIG. 14, the barrier metal layers 145c formed along the side surfaces of the fence 130 are etched in at least three directions. Thus, both side surfaces and the top surface of the barrier metal layer 145c are partially removed. That is, similar to the description of FIG. 14, holes 147c provided after the removal of the barrier metal layers 145c are formed in the regions of FIG. 18 where there were the barrier metal layers 145c.

Next, with reference to FIG. 20, similar to the description of FIG. 15, holes 147c are formed at both ends of the region where there were the barrier metal layers 145c in FIG. 18, and the barrier metal layers 145c having a shape of reduced size are formed.

Figure 21:
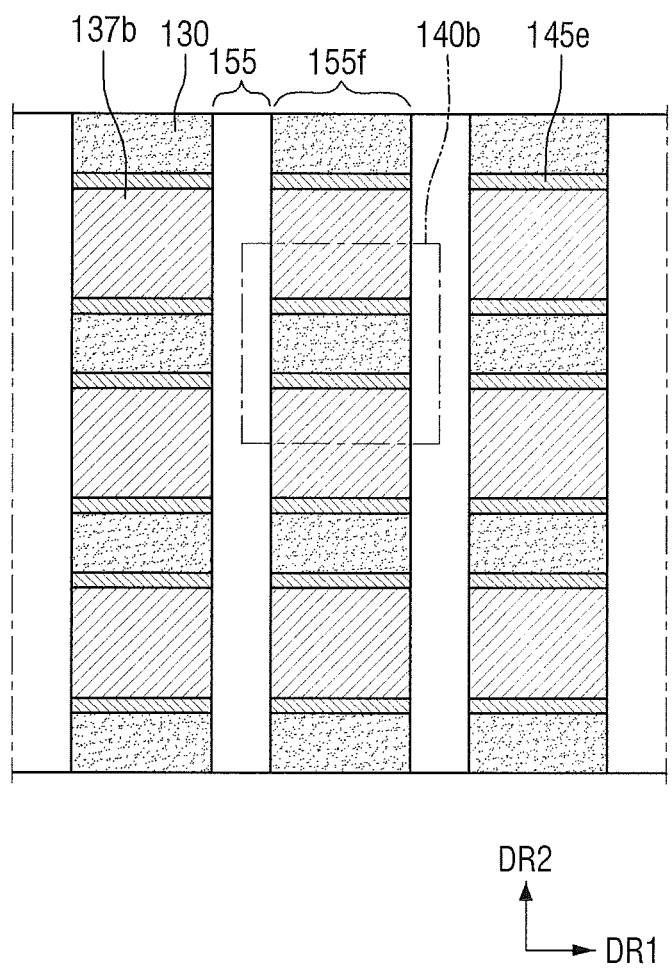
FIGS. 21 to 23 are cross-sectional views illustrating methods for manufacturing a semiconductor device according to some other embodiments of the present inventive concept.
Figure 22:
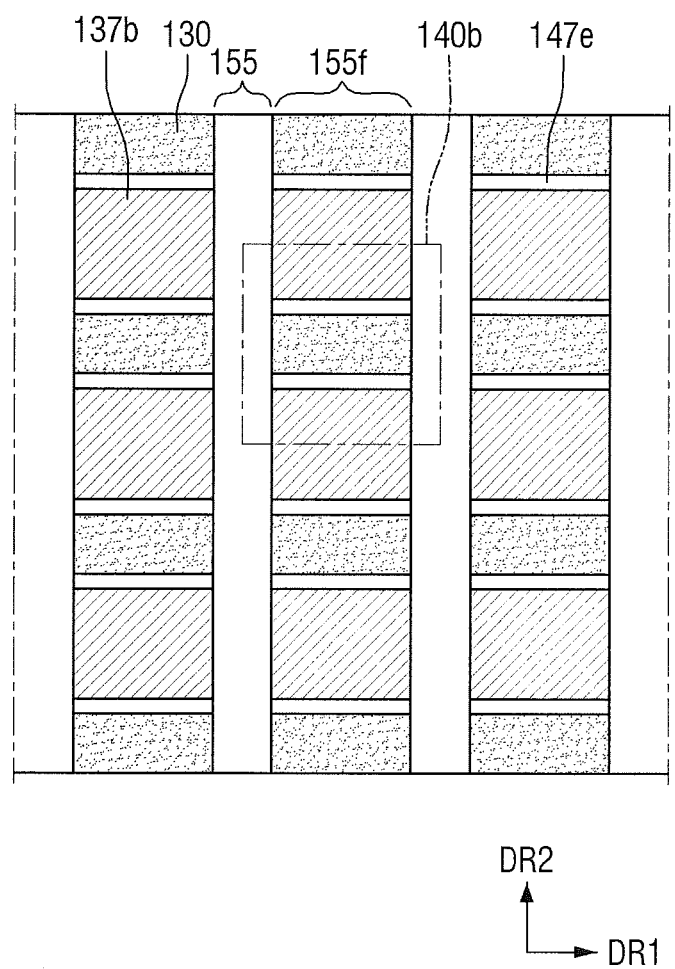
Figure 23:
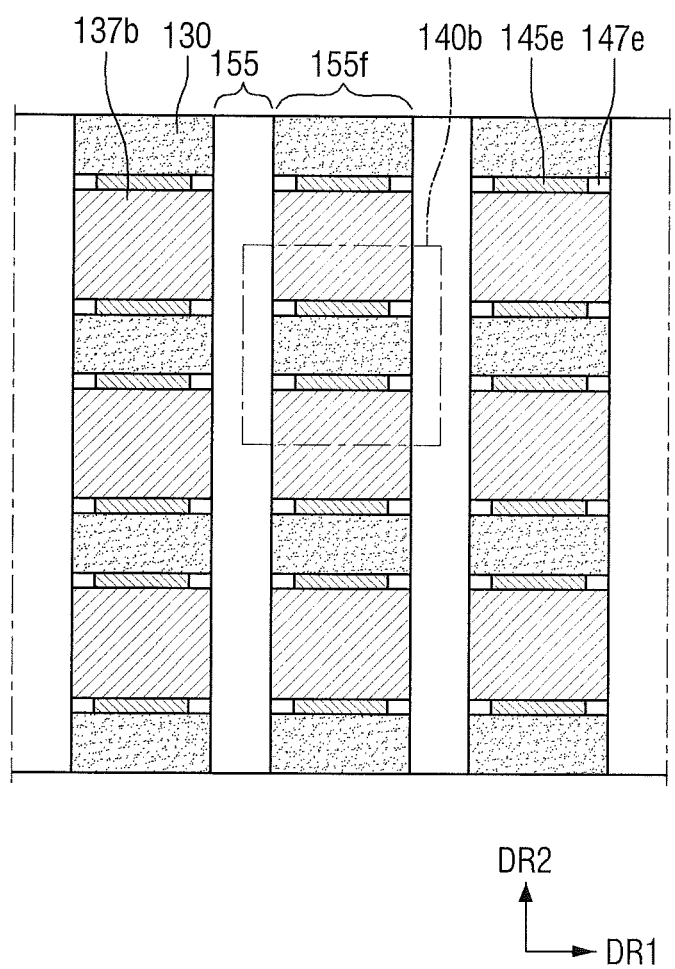

FIGS. 21 to 23 are cross-sectional views illustrating methods for manufacturing a semiconductor device according to some other embodiments of the present inventive concept.

Referring to FIGS. 21 to 23, a barrier metal layer 145e formed along the second contact 137b of the landing pad line is partially etched to remove its corner. In some embodiments of the present inventive concept, the etching may include the wet etching.

Specifically, as illustrated in FIG. 21, the fence 130 and the first mask pattern 155 may be formed on the top surface of the semiconductor device as illustrated in FIGS. 11 and 12. The first mask pattern 155 includes a first opening 155f extending in one direction on the second contact 137b. The one direction of the first opening 155f may be a second direction DR2 perpendicular to the first direction DR1. In this case, the second contact 137b may include a square structure 140b rather than a honeycomb structure 140a. Meanwhile, similar to the description of FIG. 13, the barrier metal layers 145e are formed along both side surfaces of the fence 130.

Next, with reference to FIG. 22, the barrier metal layers 145e are partially etched on the basis of the fence 130 and the first mask pattern 155 to remove their corners. Similar to the description of FIG. 14, the barrier metal layers 145e formed along the side surfaces of the fence 130 are etched in at least three directions. Thus, the both side surfaces and the top surfaces of the barrier metal layers 145e are partially removed. That is, similar to the description of FIG. 14, holes 147e provided after the removal of the barrier metal layers 145e are formed in regions where there were the barrier metal layers 145e in FIG. 21.

Next, with reference to FIG. 23, similar to the description of FIG. 15, holes 147e are formed at both ends in the regions where there were the barrier metal layers 145e in FIG. 21, and the barrier metal layers 145e having a reduced size are formed.

Thus, the landing pad according to some embodiments of the present inventive concept may be self-aligned in the first direction DR1 using the fence 130 patterned in advance, and may be formed only by a single photolithography process using the first mask pattern 155. That is, such a fence 130 may be used as a negative pattern for self-aligning the landing pad in the first direction DR1, and the first mask pattern 155 may be used as a positive pattern. Thus, it is possible to reduce the process cost.

Furthermore, by partially etching the barrier metal layer 145 formed along the second contact 137b of the landing pad line to remove its corner, a process margin may be sufficiently if needed.

Figure 24:
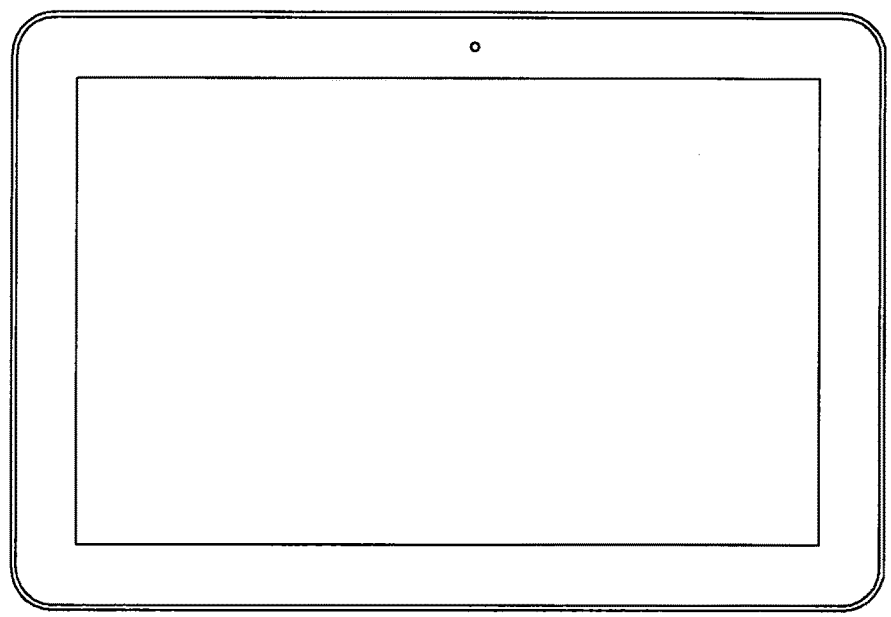
FIGS. 24 to 26 are exemplary semiconductor systems to which the semiconductor devices according to some embodiments of the present inventive concept are applicable.
Figure 25:
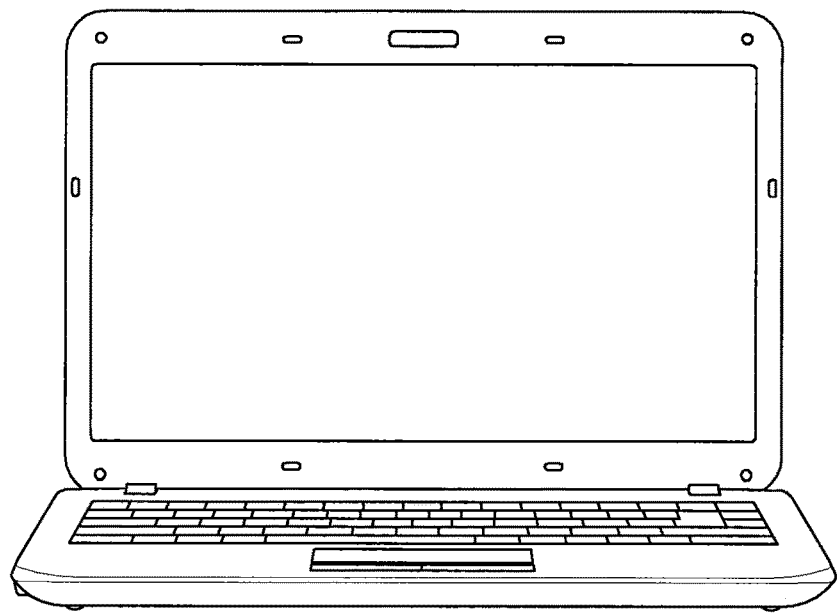
Figure 26:
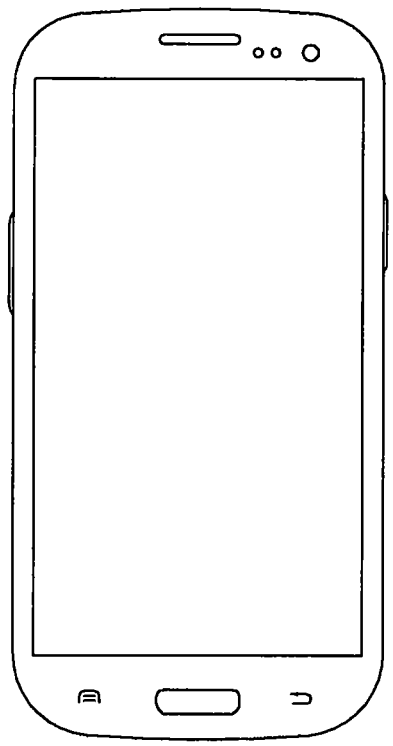

FIGS. 24 to 26 are diagrams illustrating examples of a semiconductor system to which the semiconductor devices according to some embodiments of the present inventive concept can be applied.

FIG. 24 illustrates a tablet personal computer (PC) 1200, FIG. 25 illustrates a notebook computer 1300, and FIG. 26 illustrates a smart phone 1400. The semiconductor devices according to some embodiments of the present inventive concept may be used in the tablet PC 1200, the notebook computer 1300, the smart phone 1400 and the like.

Further, it is obvious to a person skilled in the art that the semiconductor devices according to some embodiments of the present inventive concept may also be applied to other IC devices other than those set forth herein. That is, while only the tablet PC 1200, the notebook computer 1300 and the smart phone 1400 have been described above as examples in which the semiconductor devices according to this embodiment are usable, the application examples of the semiconductor devices according to some embodiments of the present embodiment are not limited thereto. In some embodiments of the present inventive concept, the semiconductor apparatus may be provided as a computer, an Ultra Mobile PC (UMPC), a work station, a net-book computer, a personal digital assistant (PDA), a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, and/or a digital video player, among others.

While the present inventive concept has been particularly illustrated and described with reference to example embodiments thereof, it will be understood by those of ordinary skill in the art that various changes in form and detail may be made therein without departing from the spirit and scope of the present inventive concept as defined by the following claims. The example embodiments should be considered in a descriptive sense only and not for purposes of limitation.

What is claimed is:

1. A method for manufacturing a semiconductor device, the method comprising:
   forming a gate line extending in a first direction in a substrate, and an impurity region on a side surface of the gate line;
   forming an insulating film pattern on the substrate, the insulating film pattern extending in the first direction and comprising a first through-hole that is configured to expose the impurity region;
   forming a barrier metal layer on the first through-hole;
   forming a conductive line contact that fills the first through-hole and that is electrically connected to the impurity region;
   forming a first mask pattern on the conductive line contact and the insulating film pattern, the first mask pattern extending in a second direction that is different from the first direction;
   forming a landing pad by performing a photolithography process using the first mask pattern; and
   removing corners of the barrier metal layer by partially etching the barrier metal layer.

2. The method of claim 1, wherein the first mask pattern comprises an opening that extends in an oblique line shape.

3. The method of claim 1, wherein the first mask pattern comprises an opening that extends in a waveform shape.

4. The method of claim 3, wherein the first mask pattern comprises an opening that extends in a perpendicular direction.

5. The method of claim 3, wherein partially etching the barrier metal layer comprises partially wet etching the barrier metal layer.

6. The method of claim 1, wherein the first direction forms an acute angle with the second direction.

7. The method of claim 1, wherein the forming an insulating film pattern comprises:
   sequentially forming an interlayer insulating film and a shielding film on the substrate;
   forming a second mask pattern on the shielding film, the second mask pattern extending in the first direction and comprising a second opening which overlaps the gate line;
   forming a second through-hole passing through the shielding film and the interlayer insulating film, using the second mask pattern as an etching mask; and
   filling the second through-hole with an insulating material.

8. The method of claim 7, wherein the insulating material has high etching selectivity over the interlayer insulating film.

9. The method of claim 7, wherein the forming the insulating film pattern comprises:
   forming the first through-hole, by removing the shielding film and the interlayer insulating film, after filling the second through-hole with the insulating material.

10. The method of claim 1, wherein the forming the conductive line contact comprises:
    forming a first contact that partially fills the first through-hole; and
    forming a second contact on the first contact.

11. A method for manufacturing a semiconductor device, the method comprising:
    forming a gate line extending in a first direction in a substrate, and an impurity region on a side surface of the gate line;
    forming insulating film patterns extending in the first direction on the substrate;
    forming a conductive line contact in a first through-hole between the insulating film patterns, using the insulating film patterns as a negative pattern;
    forming a barrier metal layer on the first through-hole;
    forming a first mask pattern on the insulating film pattern, the first mask pattern extending in a second direction that is different from the first direction and comprising a first opening;
    forming a landing pad by performing a photolithography process, using the first mask pattern as a positive pattern; and
    removing corners of the barrier metal layer by partially etching the barrier metal layer.

12. The method of claim 11, wherein the first opening extends in an oblique line shape.

13. The method of claim 11, wherein the first opening extends in a waveform shape.

14. The method of claim 13, wherein the first opening extends in a perpendicular direction.

15. The method of claim 13, wherein partially etching the barrier metal layer comprises partially wet etching the barrier metal layer.

16. A method for manufacturing a semiconductor device, the method comprising:

forming a gate line extending in a first direction in a substrate, and an impurity region on a side surface of the gate line;

forming an insulating film pattern on the substrate, the insulating film pattern extending in the first direction and comprising a first through-hole that is configured to expose the impurity region;

forming a barrier metal layer on the first through-hole;

forming a conductive line contact that fills the first through-hole and that is electrically connected to the impurity region; and removing corners of the barrier metal layer by partially etching the barrier metal layer.

17. The method of claim 16, wherein partially etching the barrier metal layer comprises partially wet etching the barrier metal layer.

18. The method of claim 16, wherein the forming the insulating film pattern comprises:

sequentially forming an interlayer insulating film and a shielding film on the substrate;

forming a mask pattern on the shielding film, the mask pattern extending in the first direction and comprising an opening which overlaps the gate line;

forming a second through-hole passing through the shielding film and the interlayer insulating film, using the mask pattern as an etching mask; and filling the second through-hole with an insulating material.

19. The method of claim 18, wherein the forming the insulating film pattern comprises:

forming the first through-hole, by removing the shielding film and the interlayer insulating film, after filling the second through-hole with the insulating material.

20. The method of claim 16, wherein the forming the conductive line contact comprises:

forming a first contact that partially fills the first through-hole; and forming a second contact on the first contact.

* * * * *